United States Patent
Hong et al.

(10) Patent No.: US 9,001,517 B2
(45) Date of Patent: Apr. 7, 2015

(54) METHOD OF FORMING FLEXIBLE CONDUCTION TRACE, FLEXIBLE CONDUCTION TRACE AND FLEXIBLE ELECTRONIC DEVICE USING THE SAME

(71) Applicant: SNU R&DB Foundation, Seoul (KR)

(72) Inventors: Yongtaek Hong, Seoul (KR); Sangwoo Kim, Seoul (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 13/922,493

(22) Filed: Jun. 20, 2013

(65) Prior Publication Data
US 2014/0085837 A1    Mar. 27, 2014

(30) Foreign Application Priority Data
Sep. 21, 2012 (KR) .................. 10-2012-0105070

(51) Int. Cl.
| | | |
|---|---|---|
| H05K 1/00 | (2006.01) |
| H01B 1/20 | (2006.01) |
| H05K 1/09 | (2006.01) |
| H01B 13/00 | (2006.01) |
| H01B 1/22 | (2006.01) |
| H05K 1/02 | (2006.01) |
| H05K 1/18 | (2006.01) |

(52) U.S. Cl.
CPC .. *H01B 1/20* (2013.01); *H05K 1/09* (2013.01); *H01B 13/00* (2013.01); *H05K 1/0283* (2013.01); *H05K 1/092* (2013.01); *H05K 2203/104* (2013.01); *H05K 1/189* (2013.01); *H05K 2201/0314* (2013.01); *H05K 2201/083* (2013.01); *H01B 1/22* (2013.01)

(58) Field of Classification Search
USPC .......................... 361/751, 749, 752; 174/255
See application file for complete search history.

(56) References Cited

U.S. PATENT DOCUMENTS

2011/0284262 A1* 11/2011 Chappell et al. ........... 174/126.1
2012/0217496 A1*  8/2012 Tischler et al. ................ 257/43

FOREIGN PATENT DOCUMENTS

KR    10-2007-0027037 A    3/2007
KR    10-2011-0053838 A    5/2011

* cited by examiner

*Primary Examiner* — Andargie M Aychillhum
(74) *Attorney, Agent, or Firm* — Sherr & Jiang, PLLC

(57) ABSTRACT

A flexible conduction trace includes a flexible line; and a plurality of conductive particles arranged in the form of pillars within the flexible line.

23 Claims, 17 Drawing Sheets

(a)　　　　　　　　　(b)　　　　　　　　　(c)

(a)          (b)

(a) (b) (c)

METHOD OF FORMING FLEXIBLE CONDUCTION TRACE, FLEXIBLE CONDUCTION TRACE AND FLEXIBLE ELECTRONIC DEVICE USING THE SAME

CROSS-REFERENCE TO RELATED APPLICATION

This application claims priority to and the benefit of Korean Patent Application No. 10-2012-0105070, filed on Sep. 21, 2012, the disclosure of which is incorporated herein by reference in its entirety.

BACKGROUND

1. Field of the Invention

The present invention relates to a method for forming a flexible conduction trace, a flexible conduction trace, and a flexible electronic device using the same.

2. Discussion of Related Art

Flexible electronic devices have been recently spotlighted. These electronic devices are freely bent in comparison with other electronic devices according to the related art and thus have been remarkably spotlighted in the field of bio engineering.

Conduction lines used in flexible electronic devices according to the related art are formed on a substrate having elasticity. Thus, when the substrate is extended or compressed, the conduction lines are extended or compressed accordingly.

SUMMARY OF THE INVENTION

As flexible wirings according to the related art are extended or compressed, their resistance values vary. This is because, as the length of a wiring varies, the cross-sectional area of the wiring is reduced or increases, and furthermore, cracks form in the wiring and affect a resistance value of the wiring.

Thus, since the resistance value of the wiring increases in a state in which tensile strain is applied to the wiring, an element or external device connected to both ends of the wiring cannot be guaranteed to operate normally, and the reliability of the entire electronic device cannot be guaranteed.

The present invention is directed to providing a conduction trace, a resistance value of which varies in a certain amount in either of a state in which an external force is applied to the conduction trace and a state in which no external force is applied to the conduction trace. The present invention is also directed to providing a flexible electronic device that operates with reliability both when an external force is applied to the flexible electronic device and when no external force is applied to the flexible electronic device. The present invention is also directed to a method of forming a flexible conduction trace, a resistance value of which varies within a certain amount in either of a state in which an external force is applied to the flexible conduction trace and a state in which no external force is applied to the flexible conduction trace.

According to an aspect of the present invention, there is provided a flexible conduction trace including: a flexible line; and a plurality of conductive particles arranged in a form of pillars within the flexible line.

According to another aspect of the present invention, there is provided a method of forming a flexible conduction trace, including: mixing a curable fluid with metal particles having magnetism and conductivity to form a mixture; and applying a magnetic field to the mixture, arranging the metal particles in a form of pillars, and hardening the mixture in a predetermined form.

According to another aspect of the present invention, there is provided a flexible electronic device including: a flexible substrate; a first electronic circuit unit and a second electronic circuit unit placed on the flexible substrate; and a flexible conduction trace electrically connecting the first electronic circuit unit and the second electronic circuit, wherein the flexible conduction trace includes a flexible line, metal pillars formed within the flexible line, and an external wiring formed on at least one surface of the flexible line.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
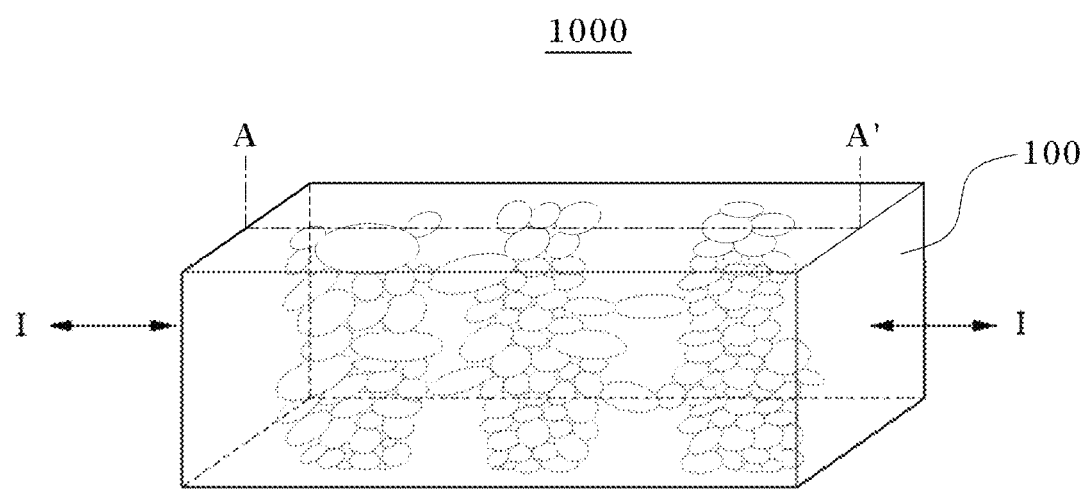
FIG. 1 illustrates an outline of a flexible conduction trace according to an exemplary embodiment of the present invention.

Since descriptions of the present invention are just embodiments for structural or functional description, the scope of the present invention should not be interpreted to be limited to the exemplary embodiments disclosed below, but can be implemented in various forms. The scope of the present invention should be understood to include equivalents that can embody the technical sprit of the present invention.

Meaning of the terms used herein should be understood as follows.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other expressions for describing the relationship between elements, i.e., "interposed" and "directly interposed," "between" and "directly between," or "adjacent to" and "directly adjacent to" should be interpreted in a similar manner.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Operations may be contextually performed in a different sequence from a described sequence unless the context clearly indicates a particular sequence. That is, operations may be performed in the same sequence as the described sequence, may be substantially simultaneously performed, or may be performed in an opposite sequence.

In the drawings referred to so as to describe the embodiments of the disclosure, the sizes, heights, and thicknesses of elements are intentionally exaggerated for convenience of explanation and easy understanding and are not enlarged or reduced according to magnification. Also, an element in the drawings may be intentionally reduced, and another element in the drawings may be intentionally enlarged.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a flexible conduction trace according to an exemplary embodiment of the present invention will be described with reference to the attached drawings. FIG. 1 illustrates an outline of a flexible conduction trace according to an exemplary embodiment of the present invention. Referring to FIG. 1, a flexible conduction trace 1000 according to an exemplary embodiment of the present invention includes a flexible line 100 and a plurality of conductive particles (see 210 of FIG. 2) arranged in the form of pillars within the flexible line 100. The sizes of the flexible line, the pillars, and the conductive particles in the drawings are not proportionally illustrated and are exaggerated to be enlarged or reduced so as to facilitate understanding of the present invention.

The flexible line 100 has flexibility and thus may be compressed or extended if an external force is applied to the flexible line 100. Thus, even when an external force is applied to an electronic device in which the flexible line 100 is formed and thus predetermined deformation occurs in the electronic device, the electronic device is not opened but may be extended or compressed. In an exemplary embodiment of the present invention, the flexible line 100 is formed of at least one material selected from the group consisting of polydimethylsiloxane (PDMS), epoxy, and polyurethane.

Figure 2:
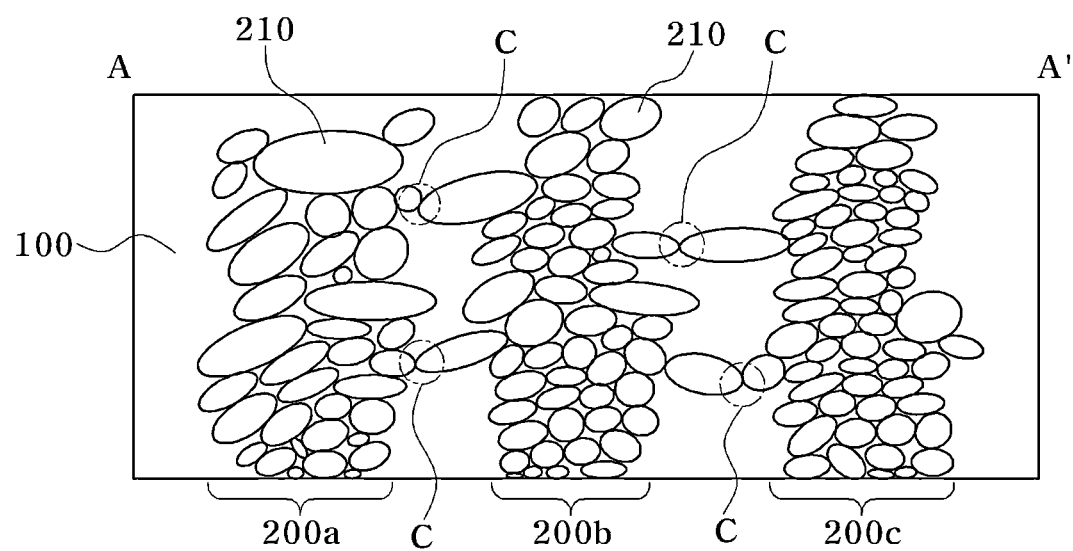
FIG. 2 is a cross-sectional view illustrating a state in which no tensile strain is applied to a flexible conduction trace according to an exemplary embodiment of the present invention.

FIG. 2 is a cross-sectional view taken along a line A-A' of FIG. 1. Referring to FIGS. 1 and 2, the plurality of conductive particles 210 are arranged in the form of pillars 200 including 200a, 200b, and 200c within the flexible line 100 of the flexible conduction trace illustrated in FIG. 1. As illustrated in FIG. 2, the pillars 200a, 200b, and 200c come in contact with each other at predetermined portions C and are electrically connected to each other. Thus, the pillars 200a, 200b, and 200c are electrically connected to each other from one end to the other end of the flexible line 100. In an exemplary embodiment of the present invention, the conductive particles 210 include conductive metal particles. The conductive particles 210 may be one among conductive ferromagnetic particles, conductive paramagnetic particles, and conductive semimagnetic particles. The conductive particles 210 may be formed of one among nickel (Ni), cobalt (Co), and iron (Fe).

Figure 3:
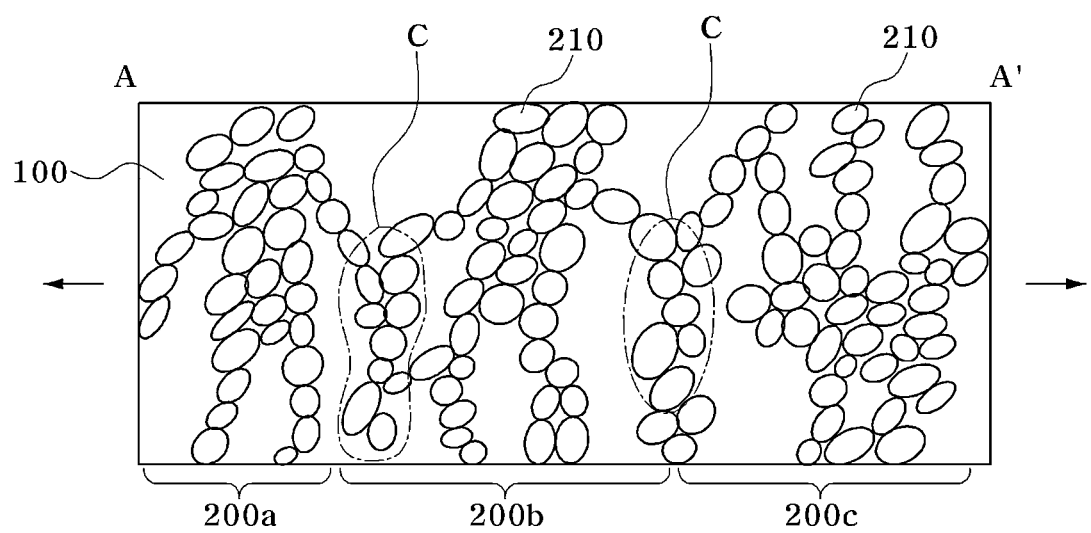
FIGS. 3 and 4 are cross-sectional views illustrating a state in which tensile strain is applied to a flexible conduction trace according to exemplary embodiments of the present invention.

FIG. 3 is a cross-sectional view illustrating a state in which tensile strain is applied to the flexible line 100 of FIG. 1 in a direction of the line A-A'. Referring to FIG. 3, the plurality of conductive particles 210 arranged in the form of pillars 200 are stretched in a tensile direction as tensile strain is applied to the flexible line 100 of FIG. 1. That is, as tensile strain is applied to the flexible line 100, a material for the flexible line 100 is extended, and as the material is extended, the conductive particles 210 are arranged to be stretched. Thus, the width of a contact surface formed between the adjacent pillars 200 increases and the number of contact portions C increases compared to a state in which no tensile strain is applied to the flexible line 100 of FIG. 1.

$$R = \rho \frac{l}{A}, \qquad (1)$$

wherein R is electric resistance, ρ is resistivity, l is a length, and A is a cross-sectional area.

As tensile strain is applied to the flexible line 100, the number of contact portions C at which the adjacent pillars 200 come in contact with each other increases, and a contact area thereof also increases. In addition, as tensile strain is applied to the flexible line 100, an increase ratio of a cross-sectional area in which current flows is greater than a tensile length. Thus, as tensile strain is applied to the flexible line 100, we could infer from mathematical equation (1) that all resistance values of the flexible conduction trace 1000 of FIG. 1 are reduced.

Figure 4:
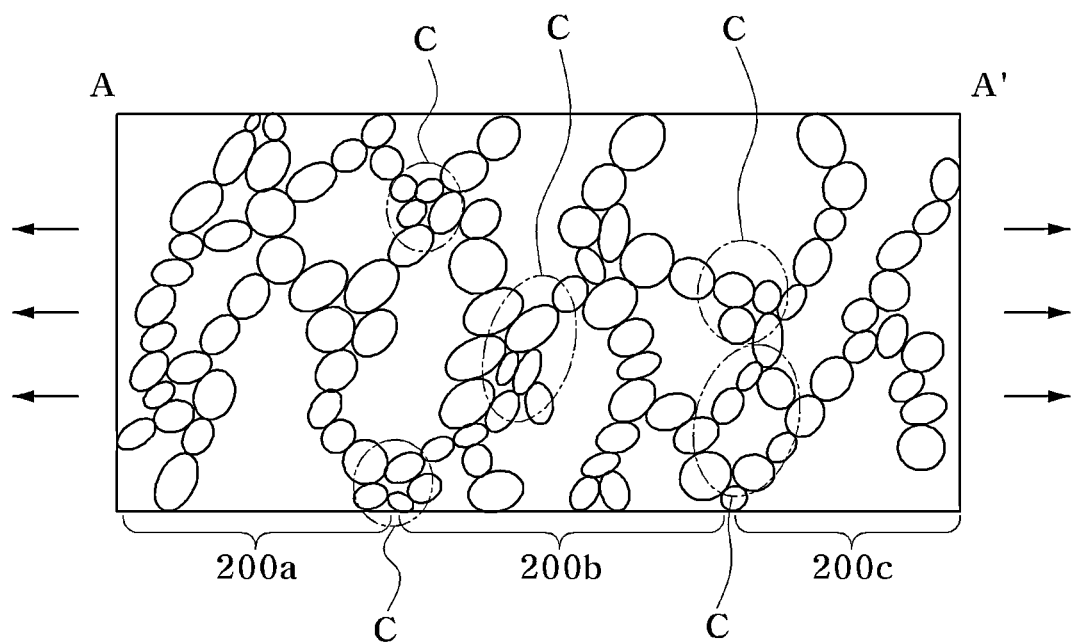

FIG. 4 is a cross-sectional view taken along a line A-A' of FIG. 1 in a state in which larger tensile strain than that of FIG. 3 is applied to the flexible line 100. Referring to FIG. 4, the plurality of conductive particles 210 are further stretched in a tensile direction as larger tensile strain is applied to the flexible line 100. That is, as tensile strain is applied to the flexible line 100, a material for the flexible line 100 may be further extended, and thus the conductive particles 210 may be arranged to be further stretched. Thus, the number of contact portions C at which the adjacent pillars 200a, 200b, and 200c come in contact with each other further increases, and a contact area thereof also increases.

Figure 5:
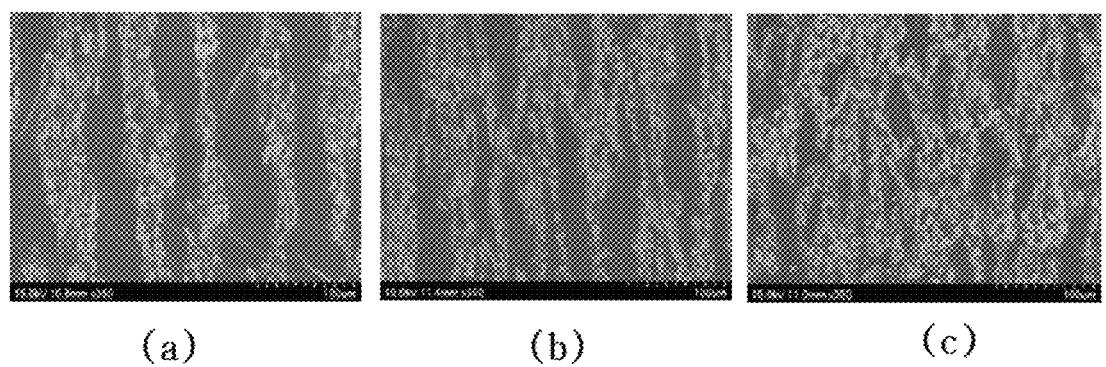
FIGS. 5A through 5C are cross sectional scanning electron microscope (SEM) images illustrating a state in which no tensile strain is applied to a flexible conduction trace and a state in which tensile strain is applied to the flexible conduction trace according to an exemplary embodiment of the present invention.

As illustrated in FIGS. 2 through 4, as a larger tensile strain is applied to the flexible line 100, the number of contact portions C increases, as does the contact area. This may be observed using a cross sectional scanning electron microscope (SEM), as illustrated in FIGS. 5A through 5C. FIG. 5A is cross sectional scanning microscope image illustrating a state in which no tensile strain is applied to the flexible line 100, FIG. 5B is a microscopic photo illustrating a state in which 5% of tensile strain is applied to the flexible line 100, and FIG. 5C is a microscopic photo illustrating a state in which 7% of tensile strain is applied to the flexible line 100. As described above, as tensile strain applied to the flexible line 100 increases, the conductive particles 210 that constitute the pillars 200 are further stretched, and the number of contact portions C at which the adjacent pillars 200 come in contact with each other and the contact area increase.

Figure 6:
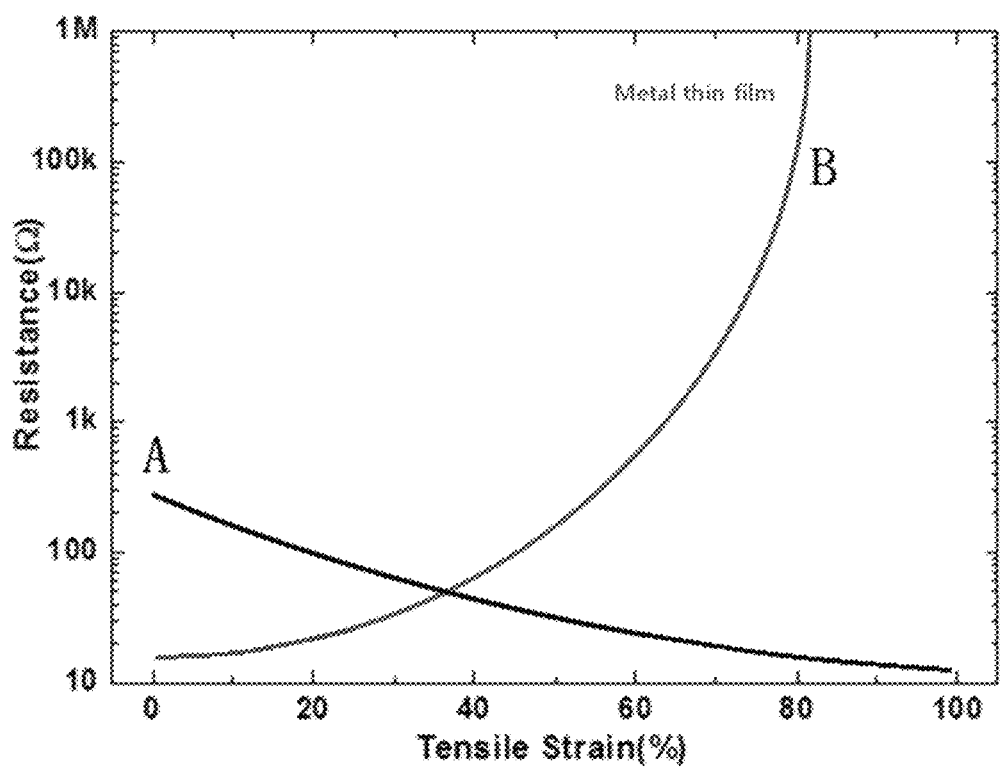
FIG. 6 is a graph showing a change in resistance values measured when tensile strain is applied to a flexible conduction trace according to an embodiment of the present invention and when tensile strain is applied to an external wiring according to the related art.

FIG. 6 illustrates a change in resistance values with respect to tensile strain applied to a wiring formed as a metal thin film according to the related art and a change in resistance values with respect to tensile strain applied to a flexible conduction trace according to an exemplary embodiment of the present invention. Referring to FIG. 6, a curve B represents a change in resistance values of the wiring formed as a metal thin film according to the related art, and a curve A represents a change in resistance values of the flexible conduction trace according to an exemplary embodiment of the present invention. A resistance value of the wiring according to the related art is about 7Ω in a state in which no tensile strain is applied to the wiring, but if 40% of tensile strain is applied to the wiring, the wiring has a resistance value of about 80Ω to 90Ω, and thus the resistance value of the wiring increases by 100% or more. Furthermore, if 65% of tensile strain is applied to the wiring, the wiring has a resistance value of about 1 kΩ, and thus there is an increase in resistance value of 12000%. Thus, when an external force is applied to the wiring, an electronic device including the wiring according to the related art cannot be guaranteed to operate normally.

However, the flexible conduction trace according to an exemplary embodiment of the present invention has a resistance value of about 200Ω before tensile strain is applied to the flexible conduction trace. If 40% of tensile strain is applied to the flexible conduction trace, the resistance value thereof is reduced to about 40Ω. Also, if about 60% of tensile strain is applied to the flexible conduction trace, the flexible conduction trace has the resistance value of about 10Ω. Thus, in the case of the flexible conduction trace according to the exemplary embodiment of the present invention, if tensile strain is applied to the flexible conduction trace, the resistance value of the flexible conduction trace is reduced and thus the performance thereof is improved. Thus, a problem of the related art that electric resistance increases as larger tensile strain is applied to the wiring can be solved. Also, a drawback of the related art that the operating reliability of the entire electronic device is lowered when an external force is applied to the electronic device can be solved.

Figure 7:
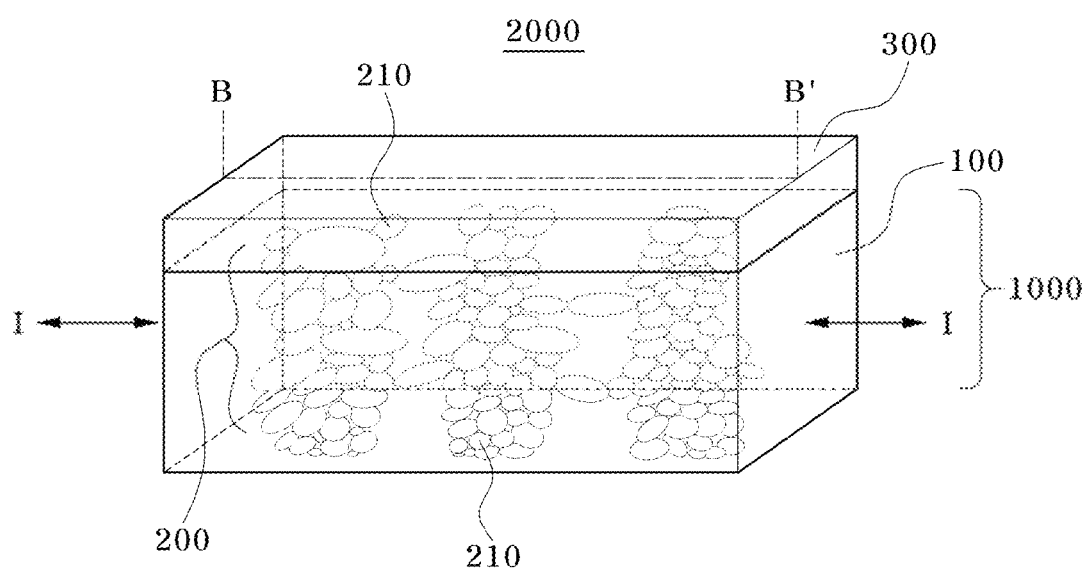
FIG. 7 is a perspective view illustrating an outline of a flexible conduction trace according to another exemplary embodiment of the present invention.

FIG. 7 illustrates an outline of a flexible conduction trace according to another exemplary embodiment of the present invention. Referring to FIG. 7, a flexible conduction trace 2000 according to another exemplary embodiment of the present invention includes a flexible line 100, a plurality of conductive particles 210 arranged within the flexible line 100 in the form of pillars, and an external wiring 300 that is formed in contact with at least one surface of the flexible line 100. Since the external wiring 300 is formed in contact with at least one surface of the flexible line 100, the flexible conduction trace 2000 and the external wiring 300 are connected to each other in parallel. The external wiring 300 is formed of one material among gold (Au), silver (Ag), aluminum (Al), carbon nanotubes (CNTs), and graphene.

Figure 8:
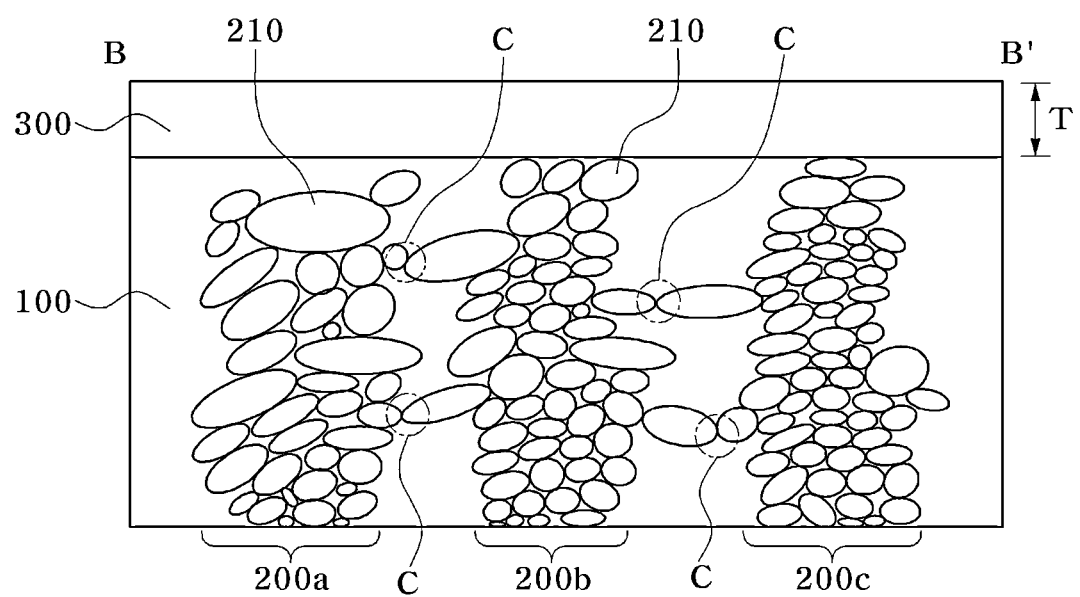
FIG. 8 is a cross-sectional view illustrating a state in which no tensile strain is applied to a flexible conduction trace according to an exemplary embodiment of the present invention.

FIG. 8 is a schematic cross-sectional view illustrating a cross section taken along a line B-B' in a state in which no tensile strain is applied to the flexible conduction trace 2000 including the external wiring 300. Referring to FIG. 8, for example, the external wiring 300 is formed in contact with at least one surface of the flexible conduction trace 2000. Thus, in an aspect of an equivalent circuit, an electrical resistor of the external wiring 300 and a resistor of the flexible conduction trace 2000 are connected to each other in parallel.

Figure 9:
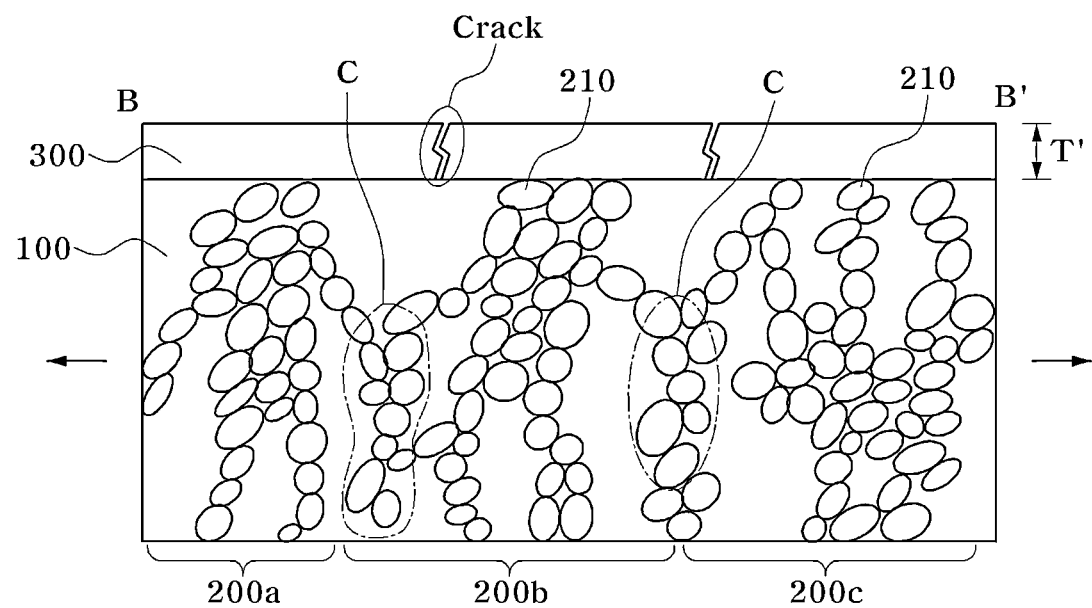
FIGS. 9 and 10 are cross-sectional views illustrating a state in which tensile strain is applied to a flexible conduction trace according to exemplary embodiments of the present invention.

FIG. 9 is a schematic cross-sectional view illustrating a cross section taken along the line B-B' in a state in which tensile strain is applied to the flexible conduction trace 2000 including the external wiring 300. Referring to FIG. 9, as larger tensile strain is applied to the flexible conduction trace 2000, the conductive particles 210 within the flexible conduction trace 2000 are stretched, the number of contact portions C at which adjacent pillars 200a, 200b, and 200c come in contact with each other increases, and a contact area thereof increases so that electric resistance of the flexible conduction trace 2000 is reduced, as described above. However, as larger tensile strain is applied to the flexible conduction trace 2000, the external wiring 300 formed on at least one surface of the flexible conduction trace 2000 is extended, its length increases, a thickness T' thereof is reduced, as illustrated in FIG. 9, and electric resistance of the flexible conduction trace 2000 increases. Also, cracks of the external wiring 300 that occur when tensile strain is applied to the flexible conduction trace 2000 also affect an increase in resistance value.

Figure 10:
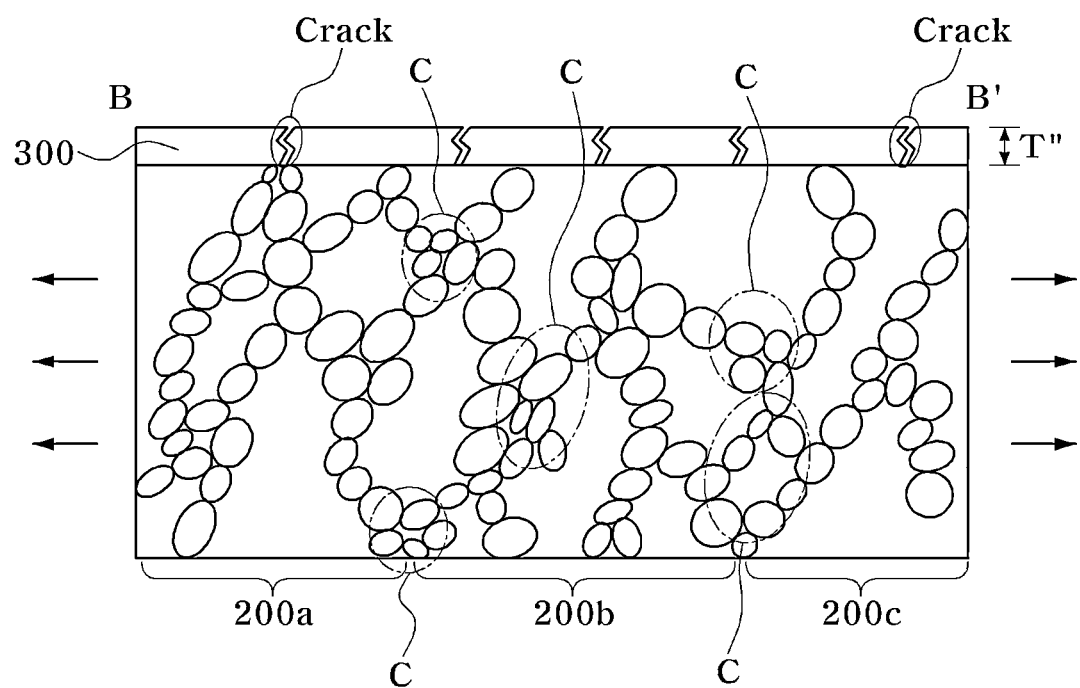

FIG. 10 is a cross-sectional view illustrating a state in which larger tensile strain than tensile strain applied in FIG. 9 is applied to the flexible conduction trace 2000. As larger tensile strain is applied to the flexible conduction trace 2000, the conductive particles 210 within the flexible conduction trace 2000 are further stretched, the number of contact portions C at which the adjacent pillars 200 come in contact with each other increases, and a contact area thereof also increases so that an electric resistance value of the flexible conduction trace 2000 is reduced, as described above. However, as larger tensile strain is applied to the flexible conduction trace 2000, the external wiring 300 is further extended, its length increases, and a thickness T'' thereof is further reduced so that electric resistance of the external wiring 300 further increases. Also, cracks of the external wiring 300 that occur when larger tensile strain is applied to the flexible conduction trace 2000, increase and affect an increase in resistance value.

Figure 11:
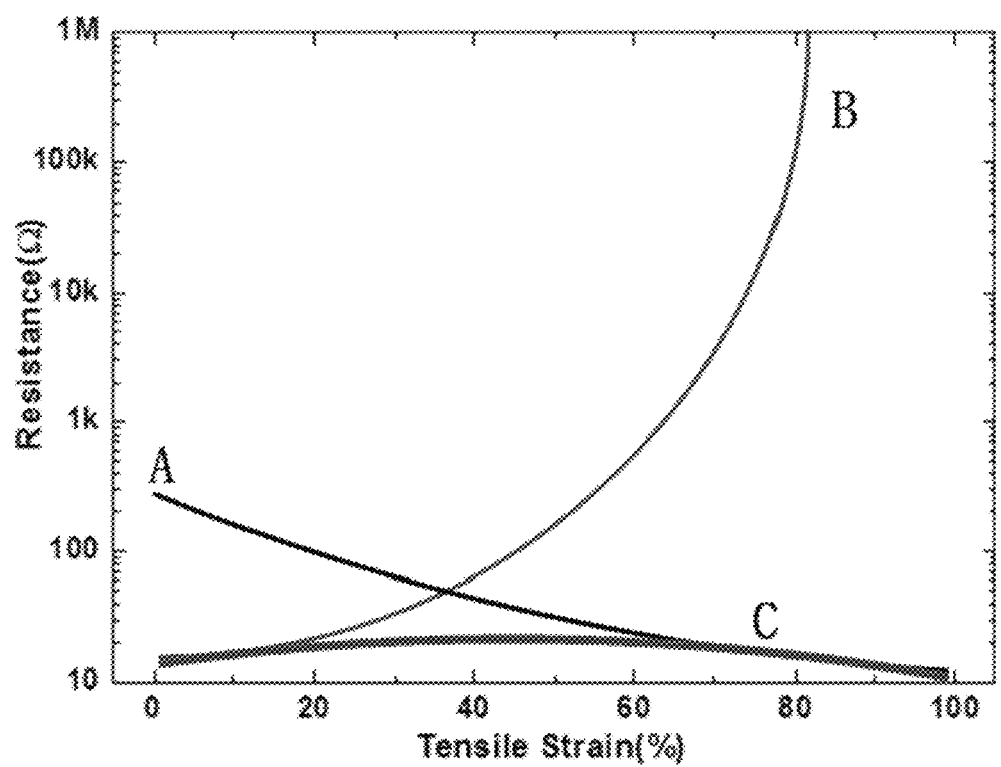
FIG. 11 is a graph showing a change in resistance values measured when tensile strain is applied to a flexible conduction trace and when tensile strain is applied to an external wiring according to an exemplary embodiment of the present invention.

FIG. 11 is a graph showing a change in resistance values measured when tensile strain is applied to the flexible conduction trace 2000 including the external wiring 300 according to an exemplary embodiment of the present invention. Referring to FIG. 11, a curve A represents a change in resistance values of the flexible conduction trace 1000 having no external wiring 300 illustrated in FIG. 3, a curve B represents a change in resistance values of the external wiring 300 that is formed in contact with a flexible conduction trace, and a curve C represents a change in resistance values of the flexible conduction trace 2000 including the external wiring 300 illustrated in FIG. 7.

$$R_1 \| R_2 = \frac{R_1 \times R_2}{R_1 + R_2} = \frac{R_2}{1 + \frac{R_2}{R_1}} \cong R_2 (R_1 \gg R_2), \tag{2}$$

where an arithmetic operation $\|$ is an arithmetic operation for obtaining a parallel resistance value between one resistor $R_1$ and another resistor $R_2$.

Referring to the above Equation 2, Equation 2 shows an arithmetic operation for obtaining a parallel resistance value of two resistors $R_1$ and $R_2$ connected to each other in parallel. As described above, if a resistance value of the one resistor $R_1$ is greater than a resistance value of the other resistor $R_2$ and when the resistors $R_1$ and $R_2$ are connected to each other in parallel, an equivalent resistance value approximates a resistance value of the resistor $R_2$ having a relatively small resistance value.

Thus, a change in resistance values of the flexible conduction trace 2000 including the external wiring 300 from a zero section in which no tensile strain is applied to the flexible conduction trace 2000 to a section in which about 20% of tensile strain is applied to the flexible conduction trace 2000 approximates the curve B having a relatively small resistance value compared to the section, and a change in resistance values of the flexible conduction trace 2000 including the external wiring 300 in a section in which 40% to 100% of tensile strain is applied to the flexible conduction trace 2000 approximates the curve A having a relatively small resistance value compared to the section. It can be seen from the result of FIG. 11 that a change in resistance values of the flexible conduction trace 2000 including the external wiring 300 from the zero section in which no tensile strain is applied to the flexible conduction trace 2000 to the section in which 100% of tensile strain is applied to the flexible conduction trace 2000 is only 15Ω to 20Ω at most. Thus, the flexible conduction trace 2000 including the external wiring 300 according to an exemplary embodiment of the present invention provides an advantage that the resistance value of the flexible conduction trace 2000 is maintained at a constant level both when tensile strain is applied to the flexible conduction trace 2000 and when no tensile strain is applied to the flexible conduction trace 2000 so that operating reliability can be guaranteed. Thus, the problem of the related art that electric resistance increases as larger tensile strain is applied to the wiring can be solved, and the drawback of the related art that operating reliability is lowered can also be solved.

Figure 12:
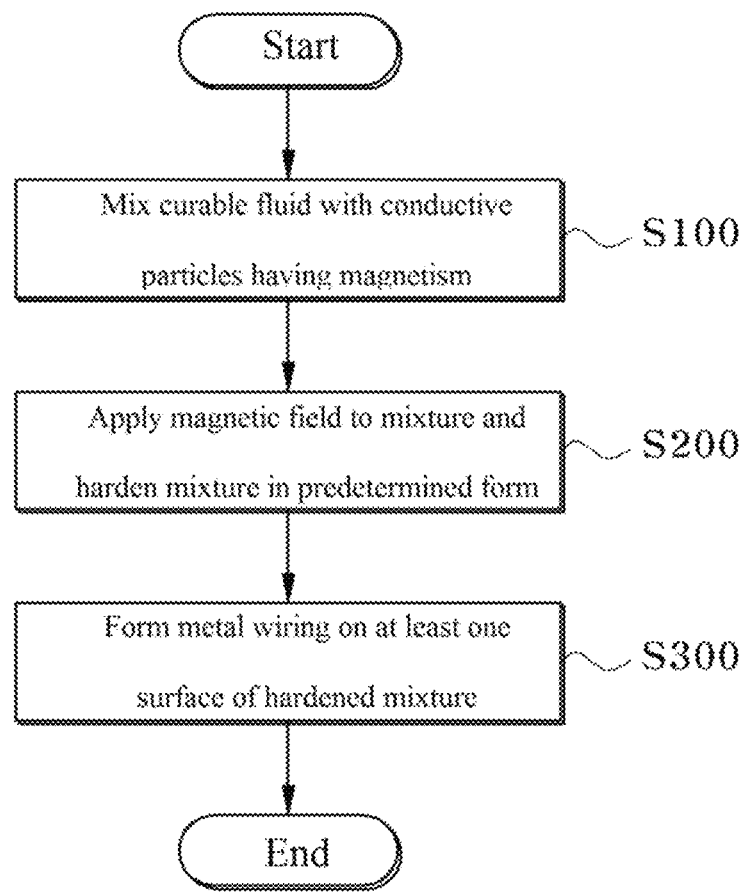
FIG. 12 is a flowchart illustrating a method of forming a flexible conduction trace according to an exemplary embodiment of the present invention.

Hereinafter, a method of forming a flexible conduction trace according to an exemplary embodiment of the present invention will be described with reference to the attached drawings. FIG. 12 is a flowchart illustrating the sequence of the method of forming a flexible conduction trace according to an exemplary embodiment of the present invention. Referring to FIG. 12, the method of forming a flexible conduction trace according to the current embodiment of the present invention includes mixing a curable fluid and conductive particles having magnetism (S100) and applying a magnetic field to the mixture, arranging the conductive particles in the form of pillars and hardening the mixture in a predetermined form (S200).

Referring to FIG. 12, the curable fluid and the conductive particles having magnetism are mixed to form a mixture (S100). In an exemplary embodiment of the present invention, the curable fluid is PDMS that is a photocurable fluid. In another embodiment of the present invention, the curable fluid is one selected from the group consisting of PDMS that is a thermal curable fluid, an epoxy resin, and polyurethane. In an exemplary embodiment of the present invention, the conductive particles having magnetism are formed of one material selected from the group consisting of Ni, Co, and Fe. In another embodiment of the present invention, the conductive particles having magnetism are one selected from the group consisting of conductive ferromagnetic particles, conductive paramagnetic particles, and conductive semimagnetic particles. Since the curable fluid generally has viscosity and the conductive particles having magnetism are not uniformly dispersed, mixing is performed to uniformly disperse the conductive particles having magnetism.

A magnetic field is applied to the mixture, the conductive particles are arranged in the form of pillars, and the mixture is hardened in a predetermined form (S200). In an exemplary embodiment of the present invention, an operation of hardening the mixture in a predetermined form may be differently performed according to the shape of the curable fluid. For example, when PDMS that is a photocurable fluid is used as the curable fluid, the mixture of the curable fluid and the conductive particles having magnetism may be placed on a transparent mold having a predetermined shape, and light may be radiated onto the transparent mold, thereby hardening the mixture. In another example, when PDMS that is a thermal curable fluid, an epoxy resin or polyurethane is used as the curable fluid, the mixture of the curable fluid and the conductive particles having magnetism may be placed in a mold having a predetermined shape and may be heated, thereby hardening the mixture.

Figure 13:
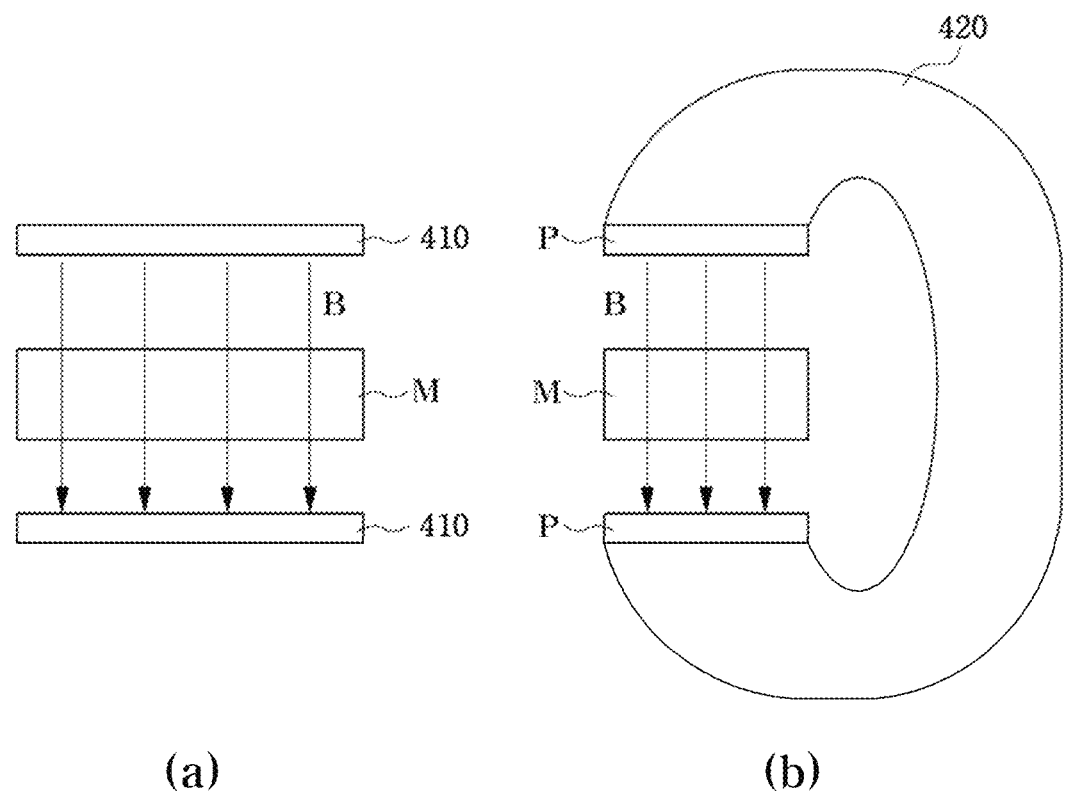
FIGS. 13A and 13B illustrate an outline of an operation of applying a magnetic field of the method of forming a flexible conduction trace illustrated in FIG. 12.

In an exemplary embodiment of the present invention, an operation of applying a magnetic field to the mixture may be performed by placing the mixture of the curable fluid and the conductive particles having magnetism in a mold and by applying a magnetic field to the mold. The magnetic field is applied to the mold so as to align the conductive particles 210 having magnetism in the direction of the magnetic field, and the curable fluid is hardened in this state, thereby obtaining the flexible conduction trace. As an example of a method of applying the magnetic field to the mixture, as illustrated in FIG. 13A, magnets 410 are attached to one side and the other side of the mold including the mixture of the curable fluid and the conductive particles having magnetism, thereby applying a magnetic field B to the mixture. The magnets 410 may be any type of magnets and may preferably be neodymium magnets. As another example, as illustrated in FIG. 13B, a magnetic force line velocity of an electro magnet 420 that is driven by electricity is induced, thereby applying the magnetic field B to a mold M through a pole piece P. However, the above example simply illustrates the method of applying the magnetic field to the mixture, and other methods of applying the magnetic field to the mixture than the method illustrated in the embodiment may be performed by one of ordinary skill in the art.

In an embodiment of the operation of applying the magnetic field to the mixture, the magnetic field is applied in a direction perpendicular to a direction of current that flows through the flexible conduction trace. The magnetic field is applied in this direction, the pillars 200 are formed by the conductive particles perpendicular to the direction of current I (see FIG. 1) so that a flexible conduction trace, electric resistance of which is reduced when tensile strain is applied to the flexible conduction trace, can be formed.

Figure 14:
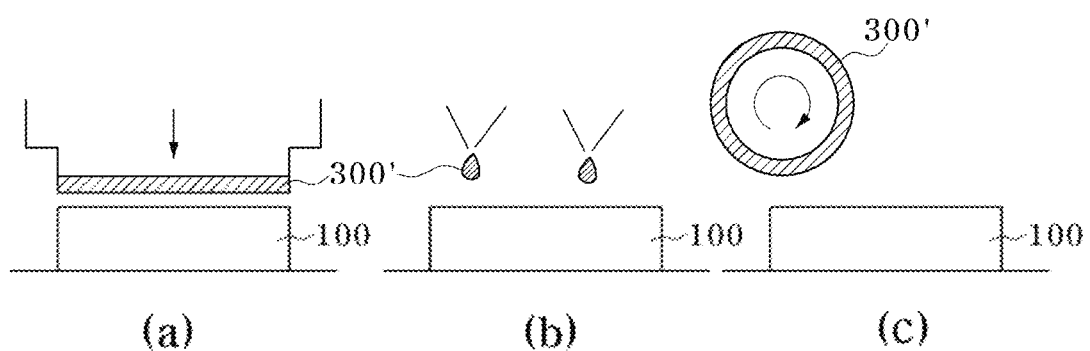
FIGS. 14A, 14B, and 14C illustrate an outline of an operation of forming an external wiring using printing, of the method of forming a flexible conduction trace of FIG. 12.

Referring to FIG. 14, in an embodiment of the present invention, an external wiring 300 is formed in contact with at least one surface of the flexible conduction trace 2000 using printing. The flexible conduction trace 2000 including a metal thin film, a change in electric resistance of which is reduced both in a state in which tensile strain is applied to the flexible conduction trace 2000 and in a state in which no tensile strain is applied to the flexible conduction trace 2000, may be formed. In an embodiment of the present invention, the external wiring 300 may be formed by a printing process such as transfer printing, in which printing is performed after a material 300' to be used in forming the external wiring 300 is deposited on a substrate, as illustrated in FIG. 14A, inkjet printing, in which the material 300' to be used in forming the external wiring 300 is jetted through a nozzle, as illustrated in FIG. 14B, or roll to roll printing, in which the material 300' to be used in forming the external wiring 300 is printed using a roll, as illustrated in FIG. 14C. The external wiring 300 may be formed of one selected from the group consisting of Au, Ag, CNTs, and graphene.

In another embodiment of the present invention, although not shown, the external wiring 300 may be formed by performing deposition. When the external wiring 300 is formed using deposition, the external wiring 300 includes one material selected from the group consisting of Au, Ag, and Al.

Figure 15:
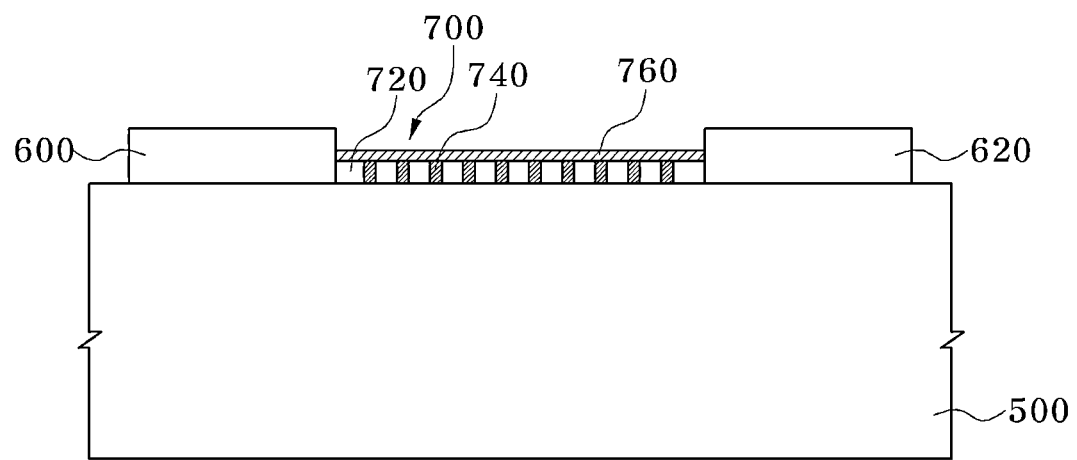
FIG. 15 is a cross-sectional view illustrating an outline of a flexible electronic device according to an exemplary embodiment of the present invention.

Hereinafter, a flexible electronic device according to an exemplary embodiment of the present invention will be described with reference to the attached drawings. FIG. 15 is a cross-sectional view illustrating an outline of a flexible electronic device according to an exemplary embodiment of the present invention. For clear description of the present embodiment, redundant descriptions of the above-described embodiments will be omitted. Referring to FIG. 15, the flexible electronic device according to an exemplary embodiment of the present invention includes a flexible substrate 500, a first electronic circuit unit 600 and a second electronic circuit unit 620 that are placed on the flexible substrate 500, and a flexible conduction trace 700 that electrically connects the first electronic circuit unit 600 and the second electronic circuit unit 620, wherein the flexible conduction trace 700 includes a flexible line 720 and metal pillars 740 formed within the flexible line 720. In an embodiment of the present invention, an external wiring 760 is formed on at least one surface of the flexible line 720.

The flexible substrate 500 has flexibility and may be freely bent. Thus, the flexible conduction trace 700 formed on the flexible substrate 500 is compressed or extended in a direction in which the flexible substrate 500 is bent. In an embodiment of the present invention, the flexible substrate 500 is formed of PDMS, polyurethane, or an epoxy resin.

The first electronic circuit unit 600 and the second electronic circuit unit 620 are formed on the flexible substrate 500 and may be digital circuits or analog circuits. The first electronic circuit unit 600 and the second electronic circuit unit 620 are connected to each other by the flexible line 720 according to the current embodiment of the present invention.

In the flexible conduction trace 700, conductive particles are arranged in the form of the pillars 740 within the flexible line 720. Thus, even when tensile strain is applied to the flexible conduction trace 700, electric resistance thereof does not increase, as described above. In an embodiment of the present invention, the external wiring 760 is formed on at least one surface of the flexible conduction trace 700. When the external wiring 760 is formed in the flexible conduction trace 700, a change in resistance values of the flexible electronic device is less than that of the related art even when tensile strain is applied to the flexible electronic device so that the flexible electronic device can operate stably.

The flexible electronic device according to the present invention operates stably even when it is bent. Thus, the flexible electronic device according to the present invention may be utilized in the field of a flexible bio sensor attached to a joint part or in the field of a display, such as a flexible display that can be freely bent. Also, the flexible electronic device according to the present invention is expected to be able to be utilized in an illumination device that can be freely bent.

EXPERIMENTAL EXAMPLE

Figure 16:
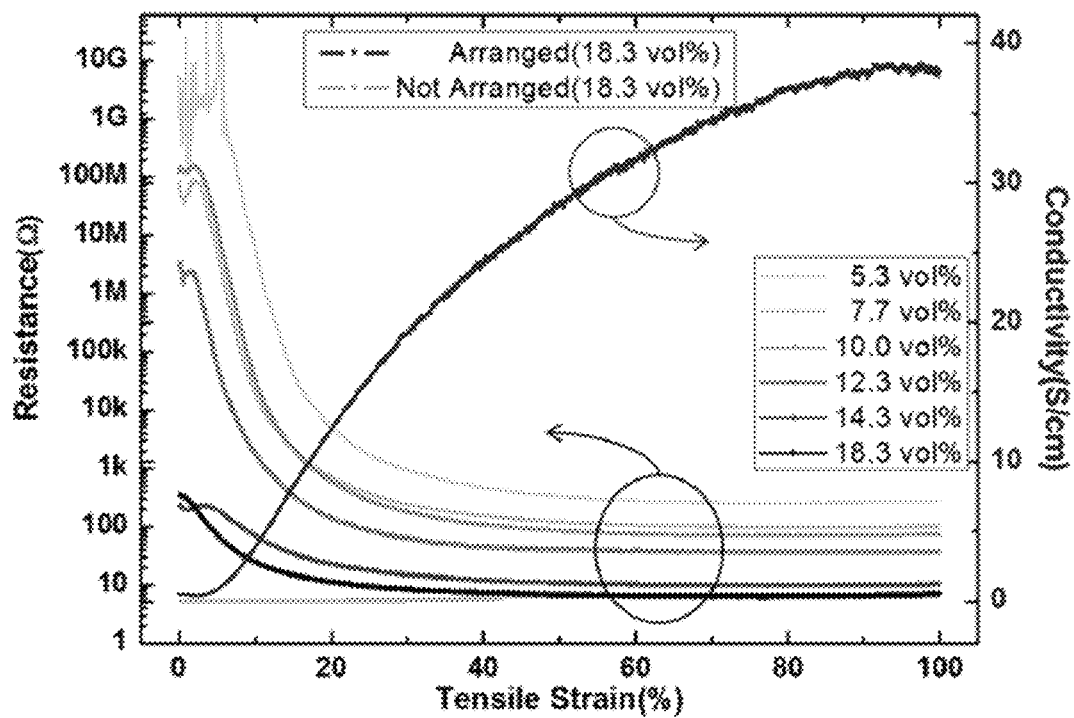
FIGS. 16 and 17 are graphs showing a change in resistance values measured when tensile strain is applied to a flexible conduction trace according to the present invention.

FIG. 16 is a graph showing a change in resistance values measured when tensile strain is applied to a flexible conduction trace according to an exemplary embodiment of the present invention. The flexible conduction trace according to an exemplary embodiment of the present invention was formed to a length of 10 mm and a width of 1 mm and was fabricated to include 5.3 vol %, 7.7 vol %, 10.0 vol %, 12.3 vol %, 14.3 vol %, and 18.3 vol % of conductive particles. A resistance value in a state in which tensile strain was applied to the flexible conduction trace was measured. Referring to FIG. 16, electric resistance measured in a state in which tensile strain was applied to the flexible conduction trace was smaller than electric resistance measured in a state in which no tensile strain was applied to the flexible conduction trace.

Figure 17:
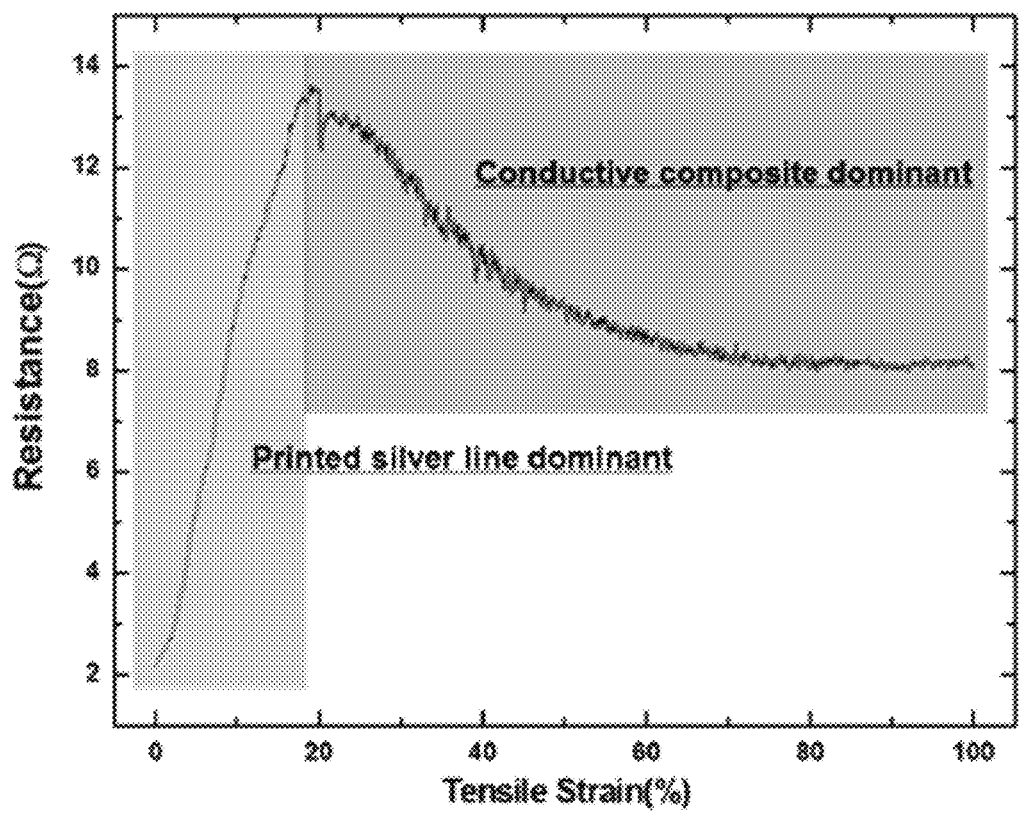

FIG. 17 is a graph showing a change in resistance values measured when tensile strain is applied to a flexible conduction trace according to an exemplary embodiment of the present invention. The flexible conduction trace was formed to a length of 10 mm and a width of 1 mm, and a silver wiring was formed on an upper portion of the flexible conduction trace using inkjet printing, as in an embodiment of the present invention. Referring to FIG. 16, when tensile strain was less than 20%, the effect of resistance due to the silver wiring was dominant, as described above. Thus, as tensile strain increased, electric resistance increased from 13Ω to 14Ω due to cracks generated in the silver wiring. However, as tensile strain further increased, the effect of electric resistance caused by the flexible conduction trace having a low electric resistance was dominant and electric resistance was stabilized at about 8 Ω.

As illustrated in FIG. 17, when anywhere from 0% to 100% of tensile strain was applied to the flexible conduction trace, a change in resistance values was about 12Ω and thus a stable resistance value could be obtained. Thus, an electronic device using the flexible conduction trace can operate more reliably. For example, if a flexible electronic device according to the present invention is a bio sensor pad attached to the skin of the human body, the bio sensor pad is extended or compressed according to movement of the human body. If a conduction trace according to the present invention is used in this electronic device, the bio sensor pad operates reliably in spite of tensile strain or compressive strain applied by movement of the human body. As another example, if the flexible electronic device according to the present invention is a flexible display, the flexible display is extended or compressed by a user's behavior of bending the flexible display. Even when this external force is applied to the flexible conduction trace, a change in resistance values of the flexible conduction trace is not large and a reliable operation of the flexible display can be guaranteed.

According to an embodiment of the present invention, even when an external force, such as tensile strain or compressive strain, is applied to a wiring, a resistance value of the wiring does not greatly vary compared to the related art. According to an embodiment of the present invention, even when an external force is applied to an electronic device, the electronic device operates stably. According to an embodiment of the present invention, a method of fabricating a wiring, a resistance value of which does not vary even when an external force is applied to the wring, is provided.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A flexible conduction trace comprising:
a flexible line compressible or extendible; and
a plurality of pillars arranged within the flexible line and each formed by a plurality of conductive particles arranged in a form of a pillar within the flexible line, wherein adjacent pillars are in direct contact with each other and electrically connected with each other and a contact area of the adjacent pillars increases when the flexible line is extended.

2. The flexible conduction trace of claim 1, wherein the flexible line is an organic silicon polymer material.

3. The flexible conduction trace of claim 1, wherein the flexible line comprises at least one selected from the group consisting of polydimethylsiloxane (PDMS), an epoxy resin, and polyurethane.

4. The flexible conduction trace of claim 1, further comprising an external wiring contacting at least one surface of the flexible line and connected to the flexible line in parallel.

5. The flexible conduction trace of claim 4, wherein the external wiring comprises one material selected from the group consisting of silver (Ag), gold (Au), carbon nanotubes (CNTs), graphene, and aluminum (Al).

6. The flexible conduction trace of claim 1, wherein the plurality of conductive particles comprise at least one selected from the group consisting of conductive ferromagnetic particles, conductive paramagnetic particles, and conductive semimagnetic particles.

7. The flexible conduction trace of claim 1, wherein the pillars are formed perpendicular to a direction of current that flows through the flexible conduction trace.

8. A method of forming a flexible conduction trace, comprising:
mixing a curable fluid with metal particles having magnetism and conductivity to form a mixture; and
forming a plurality of pillars arranged in the mixture by i) applying a magnetic field to the mixture, ii) arranging the metal particles in a form of the plurality of pillars, and iii) hardening the mixture in a predetermined form, wherein each pillar is formed by the metal particles arranged in a form of a pillar within the mixture,
wherein adjacent pillars are in direct contact with each other and electrically connected with each other and a contact area of the adjacent pillars increases when the flexible line is extended.

9. The method of claim 8, wherein the curable fluid comprises an organic silicon polymer material.

10. The method of claim 8, wherein the curable fluid comprises at least one selected from the group consisting of polydimethylsiloxane (PDMS), an epoxy resin, and polyurethane.

11. The method of claim 8, wherein the mixing of the metal particles having magnetism and conductivity is performed using at least one selected from the group consisting of nickel (Ni) particles, cobalt (Co) particles, and iron (Fe) particles.

12. The method of claim 8, wherein the mixing of the metal particles having magnetism and conductivity is performed using at least one selected from the group consisting of conductive paramagnetic particles, conductive ferromagnetic particles, and conductive semimagnetic particles.

13. The method of claim 8, wherein the applying of the magnetic field is performed by applying a magnetic field in a direction perpendicular to a direction of current that flows through the flexible conduction trace.

14. The method of claim 8, further comprising, after the hardening of the mixture in a predetermined form, forming an external wiring in contact with at least one surface of the flexible conduction trace.

15. The method of claim 14, wherein the forming of the external wiring is performed using either printing or deposition.

16. The method of claim 15, wherein the forming of the external wiring using printing is performed using one selected from the group consisting of gold (Au), silver (Ag), carbon nanotubes (CNTs), and graphene, and
the forming of the external wiring using deposition is performed using one selected from the group consisting of Au, Ag, and aluminum (Al).

17. The method of claim 8, wherein the hardening of the mixture in a predetermined form is performed using a mold having a predetermined shape.

18. A flexible electronic device comprising:
a flexible substrate;
a first electronic circuit unit and a second electronic circuit unit placed on the flexible substrate; and
a flexible conduction trace electrically connecting the first electronic circuit unit and the second electronic circuit,
wherein the flexible conduction trace comprises a flexible line compressible or extendible, a plurality of metal pillars formed within the flexible line, and an external wiring formed on at least one surface of the flexible line,
wherein each metal pillar is formed by a plurality of conductive particles arranged in a form of a pillar within the flexible line, wherein adjacent metal pillars are in direct contact with each other and electrically connected with each other and a contact area of the adjacent metal pillars increases when the flexible line is extended.

19. The flexible electronic device of claim 18, wherein the flexible line comprises an organic silicon polymer material.

20. The flexible electronic device of claim 18, wherein the flexible line comprises at least one selected from the group consisting of polydimethylsiloxane (PDMS), an epoxy resin, and polyurethane.

21. The flexible electronic device of claim 18, wherein the conductive particles comprise at least one selected from the group consisting of conductive paramagnetic particles, conductive ferromagnetic particles, and conductive semimagnetic particles.

22. The flexible electronic device of claim 18, wherein the pillars are arranged perpendicular to a direction of current that flows through the flexible conduction trace.

23. The flexible electronic device of claim 18, wherein the external wiring comprises one material selected from the group consisting of gold (Au), silver (Ag), aluminum (Al), carbon nanotubes (CNTs), and graphene.

* * * * *